(12) United States Patent
Karasawa et al.

(10) Patent No.: US 6,890,870 B2
(45) Date of Patent: May 10, 2005

(54) METHOD FOR CONTROLLING ELECTRICAL CONDUCTIVITY

(75) Inventors: Takeshi Karasawa, Hyogo (JP); Mituru Ikeuchi, Hyogo (JP)

(73) Assignee: Ushio Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/715,446

(22) Filed: Nov. 19, 2003

(65) Prior Publication Data

US 2004/0106243 A1 Jun. 3, 2004

(30) Foreign Application Priority Data

Nov. 20, 2002 (JP) .......................... 2002-336029

(51) Int. Cl.$^7$ .................. H01L 21/26; H01L 21/324; H01L 29/76; H01L 31/036; G06F 19/00
(52) U.S. Cl. ..................... 438/795; 700/121; 257/66
(58) Field of Search ................. 438/795, 797, 438/166; 700/121; 716/4; 257/66

(56) References Cited

U.S. PATENT DOCUMENTS

| | | | |
|---|---|---|---|
| 4,316,074 A | 2/1982 | Daly | |
| 4,727,044 A | 2/1988 | Yamazaki | |
| 5,399,506 A | 3/1995 | Tsukamoto | |
| 5,808,321 A | * 9/1998 | Mitanaga et al. | ............. 257/72 |
| 6,066,547 A | 5/2000 | Maekawa | |
| 6,165,875 A | 12/2000 | Fonash | |

\* cited by examiner

Primary Examiner—Craig A. Thompson
(74) Attorney, Agent, or Firm—Rader, Fishman & Grauer PLLC

(57) ABSTRACT

A method for controlling electrical conductivity to a work piece by irradiating pulse light from a light source onto the work piece, the method comprising a step of controlling the light irradiation index S of the pulse light in a $400 \leq S \leq 900$ range, wherein light energy, pulse width and light irradiation index are represented by E J/cm$^2$, τ sec, and S, and the S is defined as $E/\tau^{1/2}$.

14 Claims, 3 Drawing Sheets

METHOD FOR CONTROLLING ELECTRICAL CONDUCTIVITY

TECHNICAL FIELD OF THE INVENTION

The present invention relates to a method for controlling electrical conductivity of a semiconductor layer made of amorphous silicon and/or poly-crystal silicon in which impurities necessary to form a thin film transistor (TFT) are doped, especially, to a method for activating dopant, in which light emission is used.

DESCRIPTION OF RELATED ART

There is a great range of applications for light emission conventionally so that there are a variety of apparatuses therefore. The good example is an apparatus having an ultraviolet lamp for destroying bacteria etc. for sterilization. In electronic and electrical industries, light emission used for forming resist patters in a photolithography process or forming a thin film in a photo assisted process etc. is one of the important basic technologies.

As an example, there is laser beam type light emission with a high degree of accuracy. Since single-wavelength coherent light can be obtained from the laser beam and the light condensing property of the laser beam is excellent, it is possible to carry out partial exposure in micrometers. There are applied technologies including laser repair such as partial repair or cutting of micro-wiring patterns in which the characteristic of the laser beam is used.

In order to improve the crystalline property of a thin film, it is important how necessary energy can be efficiently supply to necessary portions. Therefore, since it is necessary to control the light emission characteristic with a high degree of accuracy to accomplish that purpose, the laser light emission technology has been used. The technology for forming a poly-crystal silicon (p-Si) thin film by irradiating examiner laser light on an amorphous silicon (a-Si) thin film is widely used and it is also used in a process for forming a device.

Since the requirement of light irradiation depend on the characteristics of a light exposed work piece and the intended purpose, an individual apparatus has been developed for each intended purpose. The laser irradiating apparatus described above is an example thereof. However, the characteristics of the laser beam are not suitable for wide area light irradiation. For example, it is necessary to intentionally expand the exposure area by using an optical system such as a beam expander in case that light is irradiated on, for example, a couple of centimeters or more area.

Since the light intensity density is reduced by expanding the exposure area, a large size high output laser, which is expensive, is required where light irradiation on a wide area with the high light intensity is necessary. Further, there is a limit to expand light from the high output laser, and in some situations, a necessary exposure area is secured by, in order, moving an exposure position of the expanded beam.

In a thin film transistor (TFT), is necessary to control electrical conductivity of p and n type semiconductor layers to a desired value respectively. Although in principle, it is possible to accomplish the purpose by doping impurity in the semiconductor and heating it in some way, the practically suitable process is determined by taking into consideration various factors such as the structure of the device to be used, kinds of material to be used, the forming method to be adopted and the like.

If the work piece is made of materials having great heat resistance, the entire work piece can be put in a heating furnace after doping impurity therein, and then heated it to high temperature, such as, a couple of hundred degrees Celsius (°C.) to a thousand degrees Celsius (°C.) for tens of minutes. Furthermore, for this purpose, light irradiation is used.

Since there are many light sources, a variety of methods have been developed. The method using laser beam irradiation is a representative method thereof.

In this method, a work piece in which impurity has been doped in a semiconductor layer is not put in a heating furnace but placed on a heater stage which is heated to a certain temperature, and then a laser beam is emitted on the work piece. Since the laser beam irradiation method (pulse modulation or pulse-number modulation) and a wavelength vary depending on the kind of the laser to be used, it is possible to select suitable ones according to the, material of the work piece and the purpose. Since it is required that a glass substrate is not soften or melted in the formation of TFT on the glass substrate, pulse laser is often used.

A selection of a method for controlling the electrical conductivity of the semiconductor of a thin film transistor (TFT) is important. The process in which the entire work piece is put in the heating furnace and heated at high temperature for a long time cannot be necessarily used, specifically. Except a case where a silica substrate which has great heat resistance is used for a TFT of a display, such a method cannot be practically used. In view of cost etc., the glass substrate is often used, and further, recently, a resin substrate is examined to be used. For these materials, it is not practical to use a high temperature furnace capable of achieving sufficient activation.

On the other hand, such laser beam irradiation technology can be used for heat, resistance materials on some level. In case that a laser beam with extremely short pulses is used, it is possible to heat an area adjacent to the surface of a work piece to be exposed by selecting the wavelength and it is possible to minimize damages to substrate material. However, usually, such a laser beam cannot be emitted to a whole area, so that the beam is scanned line by line.

Accordingly, it takes much time for the process. Specifically, there is a problem that the productivity of a middle size or large size display is low. Also, there is a certain degree of variation of beam scanning by pulse laser thereby causing nonuniformity in the surface of a product.

SUMMARY OF THE INVENTION

It is an object of the present invention to provide a light irradiation method that can be used in a various conditions.

It is another object of the present invention to provide a light irradiation method capable of improving productivity of an apparatus for reforming materials by irradiating light on a wide area with controllability, and saving costs therefore.

It is a further object of the present invention to effectively activate dopant in a semiconductor layer, which is necessary for a thin film transistor characteristic control, and to save costs therefor.

The present invention provides a method for controlling electrical conductivity of a work piece by irradiating pulse light from a light source onto the work piece, the method comprising controlling the light irradiating index S of the pulse light in a $400 \leq S \leq 900$ range, wherein light energy, pulse width and light irradiation index are represented by E J/cm$^2$, $\tau$ sec, and S, and the S is defined as $E/\tau^{1/2}$.

The light irradiation index may be controlled in a 500≦S≦900 range.

The light source may be a flash lamp.

The work piece may be made of amorphous silicon and/or poly-crystal silicon.

Further, the present invention provides a semiconductor made by the method described above.

Furthermore, the present invention provides an electrical conductivity controlling device comprising a circuit in which light irradiation index S of the pulse light is controlled in a 400≦S≦900 range, wherein light energy, pulse width and light irradiation index are represented by E J/cm$^2$, τ sec, and S, and the S is defined as E/τ$^{1/2}$.

In the present invention, the pulse width means so called "full width half maximum" which is a period corresponding to a half of a peak value of a pulse.

The present invention will become more apparent from the following detailed description of the embodiments and examples of the present invention.

DETAILED DESCRIPTION OF THE INVENTION

Description of embodiments according to the present invention will be given below referring to FIGS. 1 to 3.

Figure 1:
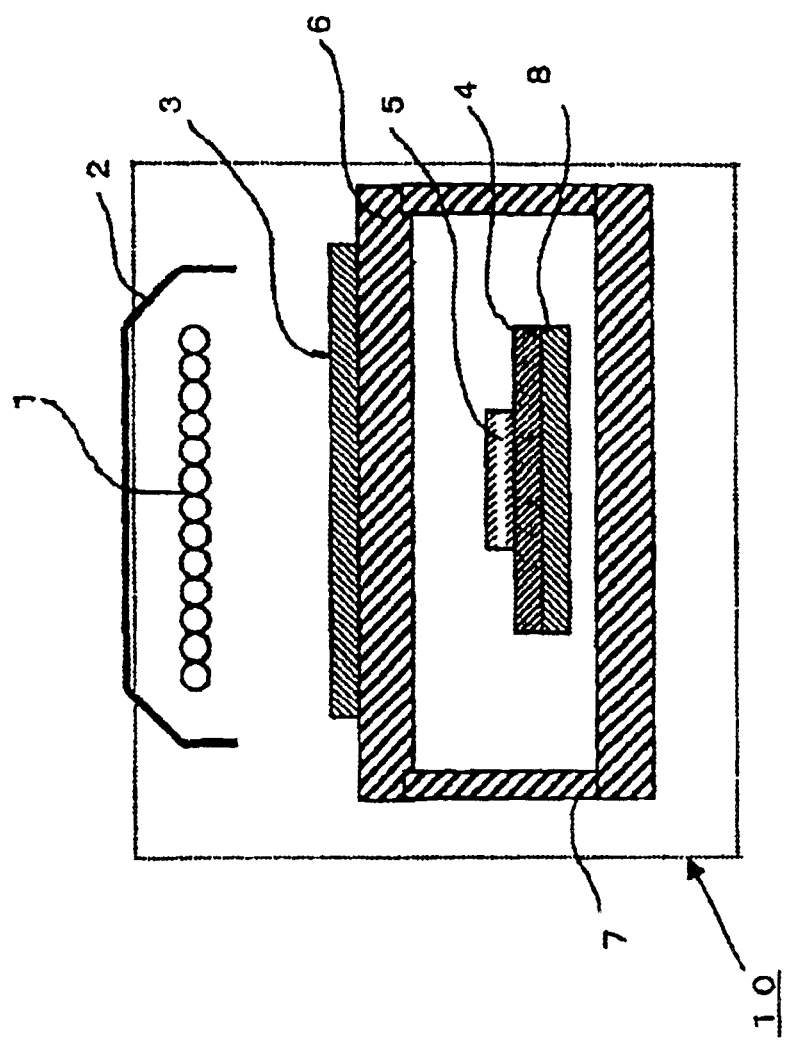
FIG. 1 is a schematic view of a light irradiating apparatus according to the present invention

FIG. 1 is a schematic view of a light irradiating apparatus according to the present invention.

The light irradiating apparatus 10 has a plurality of xenon flash lamps 1 as a light source and a reflecting plate 2 which is provided on a backside of the xenon flash lamps 1, that is, the opposite side of a work piece 5 on which light is irradiated as to improve uniformity of the light emitted from the xenon flash lamps 1 and to effectively utilize light dissipated onto the backside. A diffuser 3 is provided between the flash lamps 1 and the work piece 5 so as to further improve the uniformity of the light. The work piece 5 is placed in a chamber 7 of a gas atmosphere, such as, Ar or N$_2$ atmosphere, vacuum, or the air. The gas atmosphere is determined depending on purposes. The work piece 5 is placed on a work piece stage 4 which is usually preheated from beneath of or below the work piece 5 by a heater 8. After the work piece 5 is placed on the work piece stage 4 the distance between the work piece 5 and the lamps 1 is adjusted and then light is emitted onto the work piece 5 from the xenon flash lamps 1.

In this embodiment described below, the surface of the work piece stage 4 has an aluminum (Al) and is finished with a high reflection. The aluminum has uniform and high light reflection characteristics in which light in broadband from ultraviolet rays to infrared rays is reflected, and characteristic that it reflects the light from the xenon flash lamps 1 efficiently. The reflection characteristic of the aluminum is well known, and therefore, the detailed explanation thereof is omitted.

However, the work piece stage 4 may take a variety of forms. The surface of the work piece stage 4 may be made of ceramics (alumina, aluminum nitride and so on), metal (aluminum, stainless and so on) or metal coated with a glass film (so-called "Horo" coating). The suitable material is determined by taking into account the nature of work piece 5, the temperature to be used and so on.

Next, light irradiation index S according to the present invention will be described. When pulse light is irradiated onto the work piece 5 so as to modify or reform it, there is a certain rage of conditions with respect to energy and width of the pulse light to reform it at the same level. The inventors of the present invention discovered that the conditions to reform it at the same level can be represented by the light irradiation index S which is calculated by light energy (E J/cm$^2$) and pulse width (sec), even though light having different energy or pulse width is used.

Figure 2:
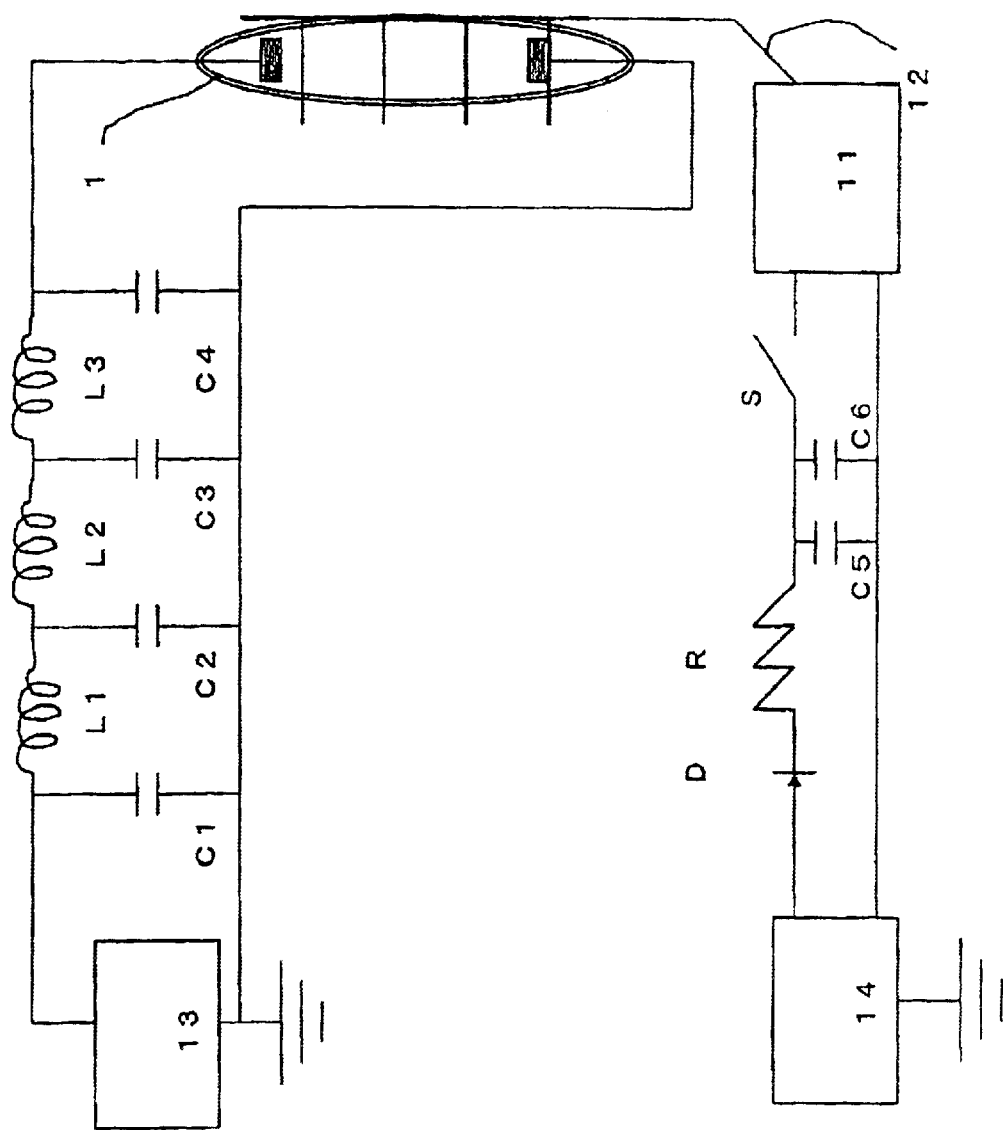
FIG. 2 shows a circuit for controlling light emission according to the present invention and FIG. 3 is a graph showing an effective range of the light irradiation index S.
Figure 3:
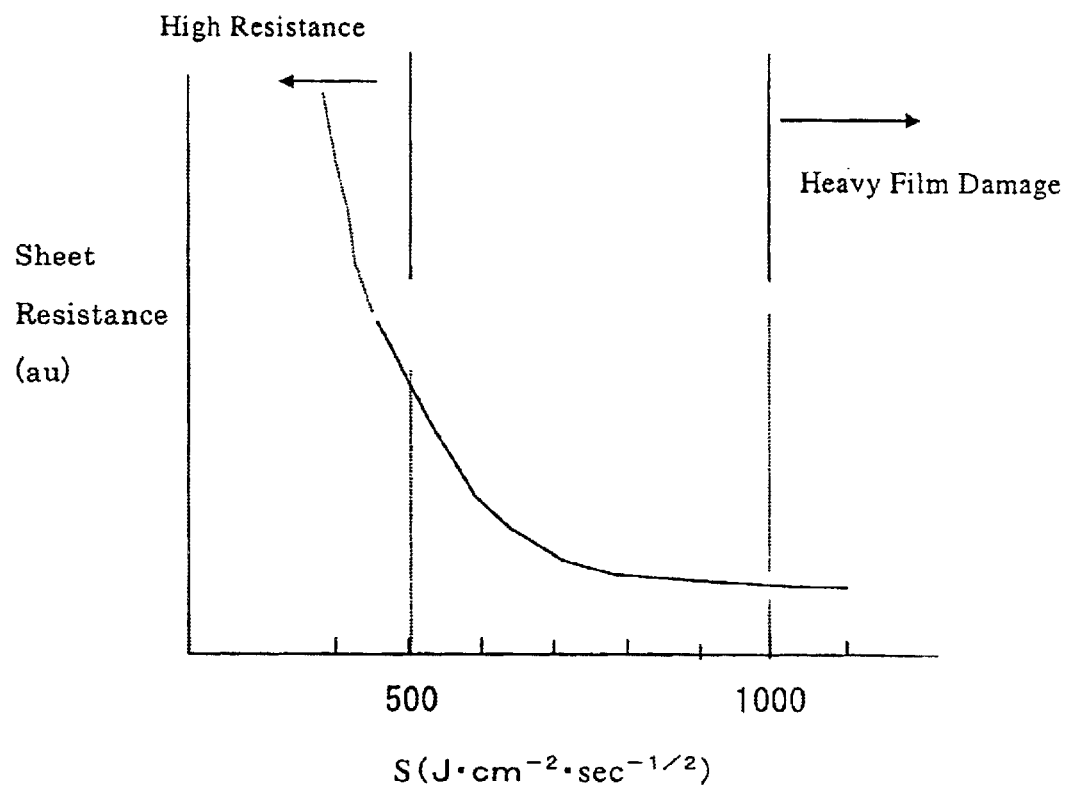

FIG. 2 shows an example of a circuit for controlling the light emission according to the present invention.

Energy from a charger 13 is stored in a circuit comprising coils L1, L2, and L3 and condensers C1, C2 and C3 so as to utilize the energy for light emission of the xenon flash lamps 1. Although, in this embodiment, a combination of three units, each of which comprises a coil and a condense; is used, the number of the units and rated capacitance of each condenser, rated inductance of each coil and so on may be selected based on the purposes.

In order to obtain desired light irradiation effect by lighting the xenon flash lamps 1, it is necessary to supply necessary energy to the lamps 1 instantaneously. Since the energy is not sufficient if it is supplied directly from an ordinary power supply the energy is stored in a device having an energy accumulation function and released at once by a (trigger) signal. The condensers C1, C2 and C3 serve for the energy accumulation function and the capacitance of each condenser is set according to the purposes. In order to discharge a suitable pulse to the load, the coils (inductance L) are provided in the circuit. The energy level and pulse width may be changed based on the combination of Cs and Ls and the number thereof.

Although in this embodiment three units are used, in the present invention it is not limited to the 3 units.

Charges stored in the condensers C1, C2 and C3 alone do not usually cause light emission of the xenon flash lamps 1. Therefore, in some way, discharge must be initiated. Accordingly, a trigger to initiate the discharge is necessary. However, if the quantity of electric charges is excessive, light emission will take place without the trigger. Since such light emission can not be controlled, in the present invention the quantity of the charges are set in the range in which light emission of the lamps 1 can be controlled. For such an outside trigger, a high voltage pulse is used, and a thin ionization area between an anode and a cathode in the lamps 1 is created. The ionization starts adjacent to a light emission tube wall due to potential gradient caused by impression of the high voltage pulse to a trigger bar 12 and spreads for a short time in the lamps 1 instantaneously thereby causing flash light.

As shown in FIG. 2, a trigger charger 14 is usually connected to a transformer 11 via a diode D, a resistor R, condensers C4, C5, and C6, and a startup switch S. A trigger bar 12 is connected to the transformer 11 and the trigger bar 12 is disposed adjacent to the light emission tube outer wall of each lamp 1.

Further, energy E and pulse width τ is obtained as described below.

The energy E of a pulse is measured by using a thermo pile type sensor and making emission light enter to a head portion via an orifice. The pulse width is obtained by measuring current wave form of the circuit by an oscilloscope. Light energy applied to the present invention is preferably about 5 to 30 J/cm$^2$ and the pulse width is preferably 0.01 to 50×10$^{-3}$ sec.

Embodiment 1

In Embodiment 1 according to the present invention up to an activation process (which is part of process used for forming a thin film transistor) for an n-type ion doping layer, which is carried out after a thin film in a amorphous state is changed to be in a poly-crystal state, is described as an example.

A glass substrate is placed in a loadlock chamber of a film forming apparatus after ordinary defatting cleaning, and then air is evacuated therefrom and transferred to a film forming chamber. By a CVD method, a 500 nm SiO$_2$ thin film is formed. Next, by a plasma CVD method, a 50 nm a-Si thin film is formed thereon. A photolithography process is carried out to the two layer structure so that a desired pattern is formed. Since etching and conditions therefor and so on are described in many documents, and therefore the detailed description is omitted.

Pulse light is emitted from the flash lamps 1 onto the work piece having the desired pattern made from the two layer structure in which the SiO$_2$ thin film (500 nm) and the amorphous Si (a-Si) thin film (50 nm) are formed on the glass substrate thereby forming poly-crystal silicon. At this point, the work piece stage 4 is heated to 300 degrees Celsius (°C.) and the value of the light irradiation index S is approximately 500 to 600.

Next a SiO$_2$ thin film is formed as a gate insulation film by the plasma CVD method. Further, by a sputtering method, a 200 to 300 nm Al thin film is deposited and patterning is carried out for a gate electrode and wiring. Then, an offset structure or a LDD structure for reducing leak current of the transistor is formed by photolithography.

Ion doping is carried out so as to form a low resistance area for a source and a drain of the transistor. P-doping is carried out by masking a P channel transistor side by resist in order to form an N channel transistor portion, and ionizing PH gas. After the ion-doping, an activation process is carried out in order that the dopant contributes to electric conductivity. For that purpose, pulse light is emitted from the flash lamps 1.

Description of a sheet resistance as evaluation characteristic of electric conductivity will be given below.

In case that a value of light emission index S is small, sheet resistance is high. As the light emission index S becomes larger, the sheet resistance becomes lower and then tends to be saturated with the light irradiation index S of around 500 to 600.

That is, when the light irradiation index S is controlled in 500≦S≦900 range, in an actual silicon semiconductor forming process, it is possible to obtain silicon semiconductor having little variation between products and having little changes of the sheet resistance.

Further, there is a situation where a thin film is damaged when the light irradiation index S is large. The trend is noticeable when the light emission index S is around 900. Thus, a large light emission index value is not suitable in practice. Therefore, if the sheet resistance is necessary to be controlled as low as possible, in this particular example, the optimal value of the light irradiation index S is approximately 500 to 600, on the other hand, in case that the sheet resistance is not necessary to be controlled if it is lowered at a certain degree and in the case where temperature rise caused by the process is necessary to be controlled as much as possible even for a short time as in a case of light emission of a flash lamp, the value of light irradiation index S can be around 400 in some cases.

Embodiment 2

In Embodiment 2 according to the present invention up to an activation process (which is part of process used for forming a thin film transistor) to a n-type ion doping layer that is carried out after a thin film in a amorphous state is changed to be in a poly-crystal state, is described as an example.

A glass substrate is placed in a load lock chamber of a film forming apparatus after ordinary defatting cleaning, and then air is evacuated therefrom and transferred to a film forming chamber. By a CVD method, a 500 nm SiO$_2$ thin film is formed. Next, by a plasma CVD method, a 50 nm a-Si thin film is formed thereon. A photolithography process is carried out to the two layer structure so that a desired pattern is formed. Since etching and conditions therefor and so on are described in many documents, and therefore the detailed description is omitted.

Pulse light is emitted from the flash lamps 1 onto the work piece having the desired pattern made from the two layer structure in which the SiO$_2$ thin film (500 nm) and the amorphous Si (a-Si) thin film (50 nm) are formed on the glass substrate, thereby forming poly-crystal silicon. At this point, the work piece stage is heated to 300 degrees Celsius (°C.) and the value of the light emission index S is approximately 500 to 600.

Next a SiO$_2$ thin film is formed as a gate insulation film by the plasma CVD method. Further, by a sputtering method, a 200 to 300 nm Al thin film is deposited and patterning is carried out for a gate electrode and wiring. Then, an off set structure or a LDD structure for reducing leak current of the transistor is formed by photolithography.

Ion doping is carried out so as to form a low resistance area for a source and a drain of the transistor. B-doping is carried out by masking a P channel transistor side by resist in order to form an N channel transistor portion, and ionizing B$_2$H$_6$ gas. After the ion doping, an activation process is carried out in order that the dopant contribute to electric conductivity. For that purpose, pulse light is emitted from the flash lamps 1.

In case that a value of light irradiation index S is small, sheet resistance is high. As the light irradiation index S becomes larger, the sheet resistance becomes lower and then starts to be saturated with the light irradiation index S of around 500 to 600. Unlike in the case of the N channel formation, a saturation point that there is little changes is not clearly shows however, it is clear that it has tendency to be settled to around a certain value which is not problematic with respect to practical use.

That is, when the light irradiation index S is controlled in 500≦S≦900 range, in an actual silicon semiconductor forming process, it is possible to obtain silicon semiconductor having little variation between products and having little changes of the sheet resistance.

Further, as in the case of N channel formation, there is a situation where a thin film is damaged when the light irradiation index S is large. The trend is noticeable when the light irradiation index around 900. Thus, a large light irradiation index value is not suitable in practice. Therefore, if the sheet resistance is necessary to be controlled as low as possible, in this particular example, the optimal value of the light irradiation index S is approximately 500 to 600, too.

As in Embodiments 1 and 2, the light irradiation index S has a suitable range. FIG. 3 shows the aspect. In FIG. 3, the horizontal axis shows the light irradiation index S and the vertical axis shows, in arbitrary unit, sheet resistance of silicon semiconductor after light irradiation.

In conventional light irradiating apparatus, light intensity is controlled. In that case, necessary light intensity is largely different, depending on the material of the object, to an extent that the value of the light intensity differs at a single digit. An apparatus for changing the shape of a beam by an optical system, such as a laser anneal apparatus is not suitable for carrying out a process simultaneously and extensively. Further in a light intensity control, it is difficult to set conditions to have uniform affect in only a necessary depth portion while not to have unnecessary and adverse effect in a deeper portion.

However, the apparatus according to the present invention can be used for any intended usage from usage in which conventionally laser irradiation is used, to usage in which extensive and simultaneous irradiation is required. By pulse-lighting a light source and controlling the light irradiation index to $S=E/\tau^{1/2}$ value, it is possible to prevent unnecessary effect, such as unintended diffusion of impurity, cracking abnormal application of heat to foundation material, and, at the same time, it is possible to form and/or reform a thin film having desired electric conductivity.

The disclosure of Japanese Patent Application No. 2002-336029 filed on Nov. 20, 2002 including specification, drawings and claims is incorporated herein by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention. Further, the present invention possesses a number of advantages or purposes, and there is no requirement that every claim directed to that invention be limited to encompass all of them.

What is claimed is:

1. A method for controlling electrical conductivity of a work piece by irradiating pulse light from a light source onto the work piece, the method comprising a step of:

controlling the light irradiation index S of the pulse light in a $400 \leq S \leq 900$ range, wherein light energy, pulse width and light irradiation index are represented by E J/cm$^2$, $\tau$ sec, and S, and the S is defined as $E/\tau^{1/2}$.

2. The method according to claim 1, wherein the light irradiation index is controlled in a $500 \leq S \leq 900$ range.

3. The method according to claim 1, wherein the light source is a flash lamp.

4. The method according to claim 1, wherein the work piece is made of amorphous silicon or poly-crystal silicon.

5. The method according to claim 1, wherein the work piece is made of amorphous silicon and poly-crystal silicon.

6. A semiconductor made by the method according to claim 1.

7. The semiconductor according to claim 6, wherein the semiconductor is made of amorphous silicon.

8. The semiconductor according to claim 6, wherein the semiconductor is made of poly-crystal silicon.

9. The semiconductor according to claim 6, the semiconductor is made of amorphous silicon and poly-crystal silicon.

10. An electrical conductivity controlling device comprising a circuit in which light irradiation index S of pulse light is controlled in a $400 \leq S \leq 900$ range, wherein light energy, pulse width and light irradiation index are represented by E J/cm$^2$, $\tau$ sec, and S, and the S is defined as $E/\tau^{1/2}$.

11. The electrical conductivity device according to claim 10, wherein the light irradiation index is controlled in a $500 \leq S \leq 900$ range.

12. The electrical conductivity controlling device according to claim 10, wherein the light source is a flash lamp.

13. The electrical conductivity controlling device according to claim 10, wherein the work piece is made of amorphous silicon or poly-crystal silicon.

14. The electrical conductivity controlling device according to claim 10, wherein the work piece is made of amorphous silicon and poly-crystal silicon.

* * * * *